United States Patent [19]

Johnson

[11] 4,351,108

[45] Sep. 28, 1982

[54] PACKAGING SYSTEM FOR SEMICONDUCTOR BURN-IN

[75] Inventor: James E. Johnson, Katy, Tex.

[73] Assignee: Reliability, Inc., Houston, Tex.

[21] Appl. No.: 165,969

[22] Filed: Jul. 7, 1980

[51] Int. Cl.³ .............................................. H05K 13/04
[52] U.S. Cl. ...................................... 29/741; 206/328; 324/158 F
[58] Field of Search .................... 324/158 F; 206/328, 206/331, 334; 29/741

[56] References Cited

U.S. PATENT DOCUMENTS

| | | | |
|---|---|---|---|
| 3,235,797 | 2/1966 | Boscia et al. | 324/158 F |
| 3,237,761 | 3/1966 | Madden | 206/331 |
| 3,454,154 | 7/1969 | Peters et al. | 206/331 |
| 3,701,077 | 10/1972 | Kelly | 324/158 F |
| 3,733,672 | 5/1973 | Bohannon | 29/741 |
| 4,178,545 | 12/1979 | Kneifel | 324/158 F |

Primary Examiner—Lowell A. Larson
Attorney, Agent, or Firm—Murray Robinson; David Alan Rose; William E. Shull

[57] ABSTRACT

This invention relates generally to burn-in apparatus and methods for stressing the physical and electrical limits of electronic components under controlled environmental and load conditions and more particularly to a system for temporarily packaging a plurality of semiconductors such that they can be connected to a common electrical input while under controlled environmental conditions including extremes of temperature. The invention has special utility in the handling of integrated circuit devices of the dual-in-line packaging type.

16 Claims, 6 Drawing Figures

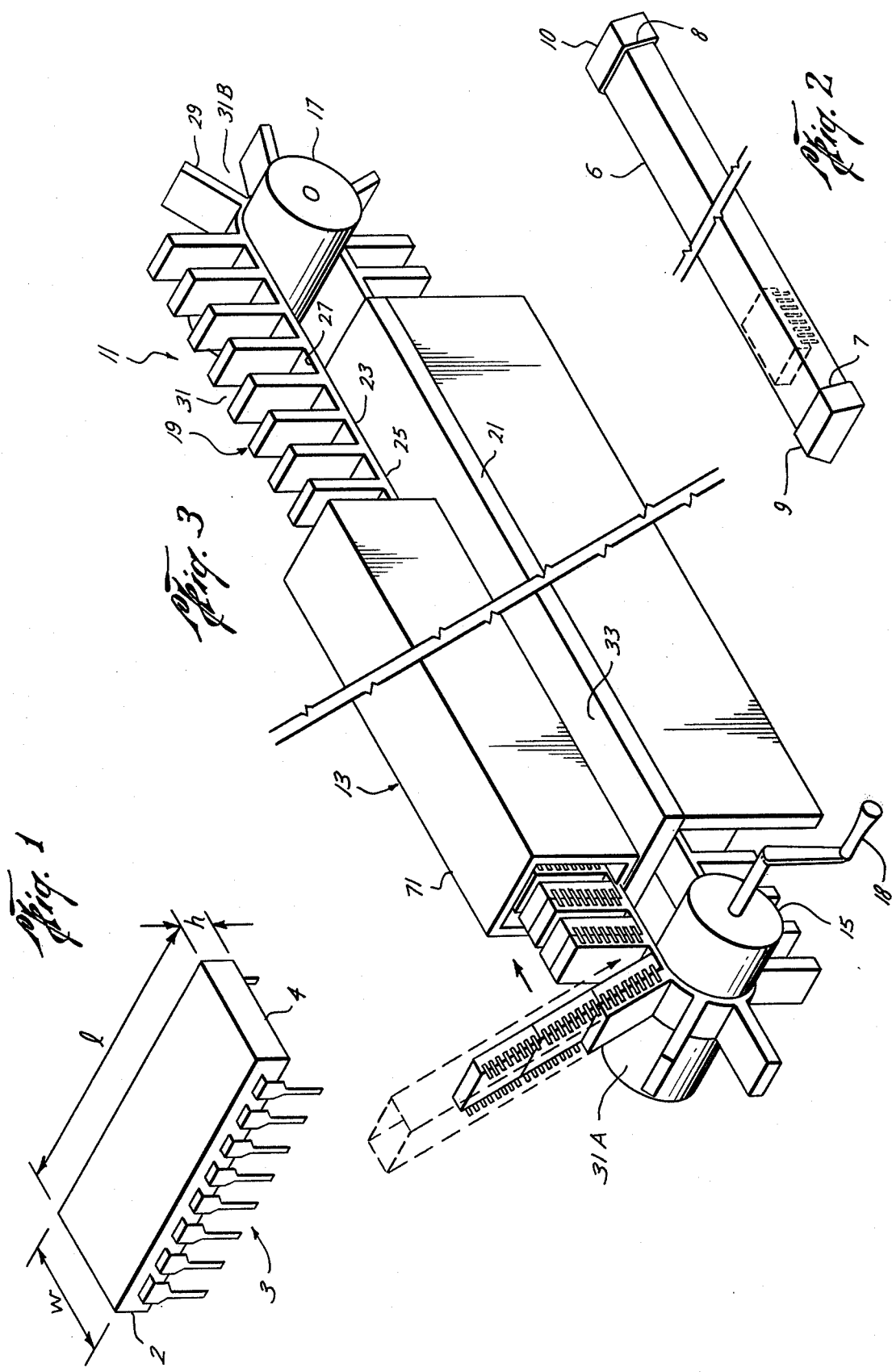

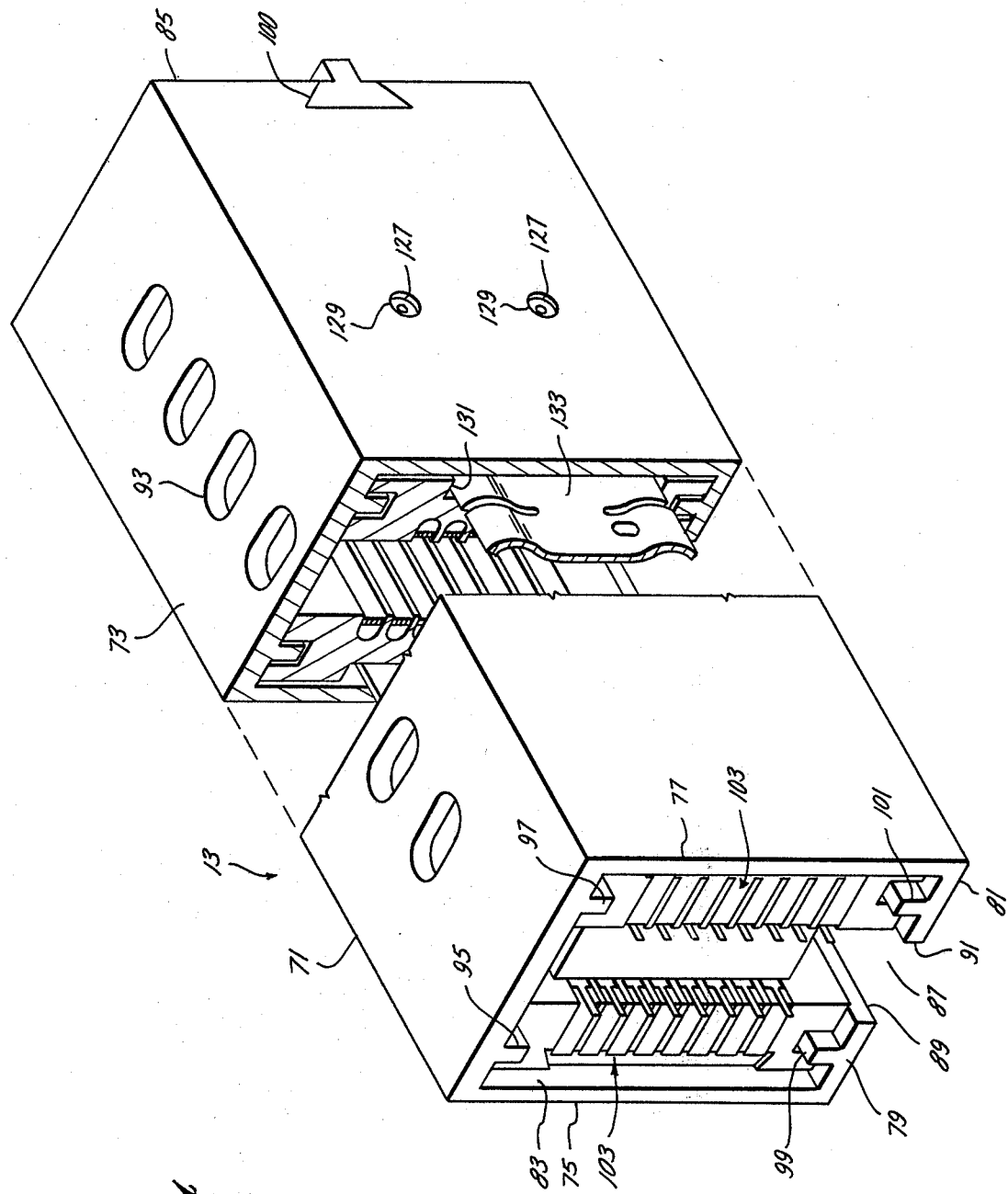

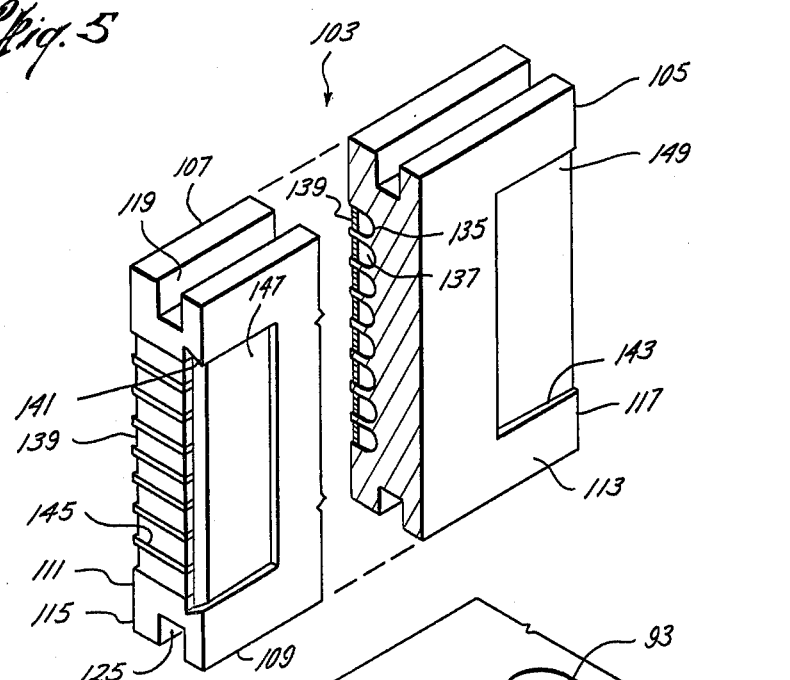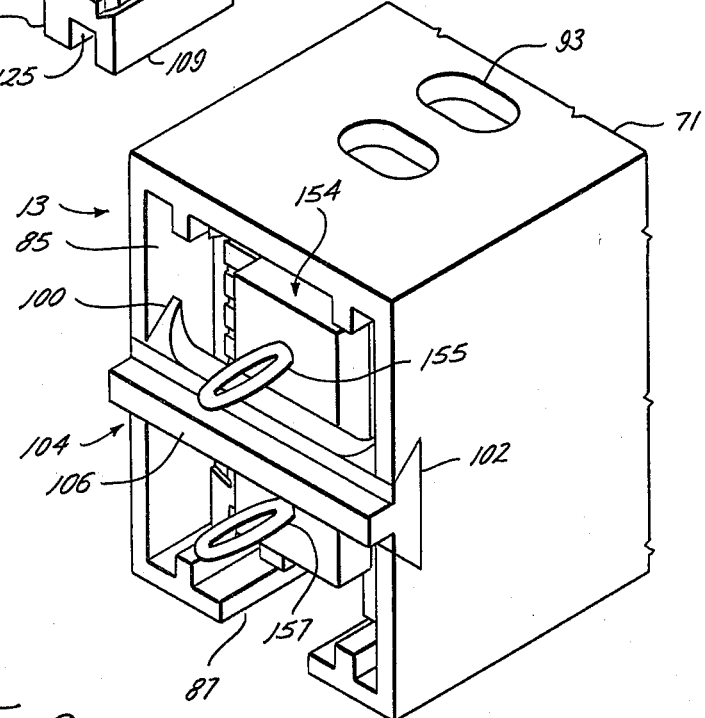

PACKAGING SYSTEM FOR SEMICONDUCTOR BURN-IN

CROSS REFERENCE TO RELATED APPLICATION

This application concerns an improvement upon the system and apparatus disclosed in United States of America patent application Ser. No. 55,058, filed June 5, 1979, by James I. Bradshaw, entitled Burn-In Chamber assigned to the same assignee as the present application.

BACKGROUND OF THE INVENTION

One of the most rapidly advancing technlogies at the present time, electronics, is centered around semiconductors, particularly integrated circuits. According to present practices, semiconductors are mass-produced and installed in highly sophisticated, complex and costly equipment. As with many mass-produced products, semiconductors are prone to failure, in many cases within the first few thousand hours of operation. The complexity of the equipment within which such semiconductors are installed makes such post-installation failures highly undesirable. For example, when equipment reaches the final inspection stage of production before semiconductor failures are detected, the high level skills required for testing and repair add a significant cost to production expenses. Even more significantly, when the product is in the field and a service technician must make warranty repairs, the costs incurred can have a marked effect on profitability. As a result, manufacturers of electronic equipment are demanding ever greater quality and dependability in commercial grade semiconductors.

Such quality and dependability are enhanced substantially by detection of those semiconductors likely to fail in the first few hours of operation prior to installation of such semiconductors in electronic equipment. One of the most effective methods of making such a detection is referred to as "burn-in." According to burn-in techniques, semiconductors are stressed within their physical and electrical limits prior to installation so that those semiconductors likely to become early failures in completed equipment can be uncovered. More particularly, burn-in procedures of the prior art involve removably mounting a large number of semiconductors on one or more printed circuit boards having semiconductor sockets thereon ("component boards"); placing such component boards with the semiconductors mounted thereon in a chamber whose environment, particularly temperature, is controllable; applying dc biases to each semiconductor on each board in such a manner as to reverse, and sometimes forward, bias as many of such semiconductor's junctions as possible, and/or actively clocking each semiconductor, and/or loading the outputs of each semiconductor to maximum rated conditions, such application of dc biases, clocking signals and loads being accomplished substantially simultaneously to each semiconductor; removing the component boards from the chamber after the semiconductors have been subjected to the environmental condition of the chamber and the biases, clocking signals and loads for a designated period of time; and removing the semiconductors from the component boards. The semiconductors can then be electrically tested by applying a room temperature test of critical dc parameters, e.g., input currents and thresholds, output voltages and currents, and, in the case of digital components, by making a functional test to verify truth table performance. In this way, the semiconductors that fail during burn-in are detected and segregated from those that do not fail. Because the semiconductors that do not fail during the burn-in process have withstood substantial stress, such semiconductors possess a high degree of dependability and can be installed in highly complex equipment with confidence that such semiconductors will not fail prematurely.

A substantial portion of the total time and costs involved in prior art burn-in procedures is consumed in temporarily packaging the semiconductors so that the semiconductors can be placed in the controlled environment while various electrical signals are applied to the terminals of such semiconductors. For example, the costs of the printed circuit boards and the semiconductor sockets are high. Furthermore, such boards and sockets deteriorate at an accelerated rate due to the extreme conditions of the controlled environment and must be replaced on a regular basis. In addition, in order to avoid damage to the semiconductor terminals, the semiconductors are mounted on and removed from the component boards by hand. Such a manual process, in particular mounting the semiconductors, is a tedious procedure to which substantial time and labor must be devoted. It has been found, for example, that it takes approximately one minute to load six integrated circuit devices onto a component board. As a result of the costs of such prior art temporary packaging techniques, the total cost of burn-in has been substantially inflated.

SUMMARY OF THE INVENTION

The present invention is a system for temporarily packaging a plurality of semiconductors in such a way that they can be connected within a burn-in chamber to a common electrical input and wherein the time and costs of the labor and equipment required for such packaging are relatively small.

The system of the present invention includes a cartridge device and a loading device. The cartridge device includes an elongate chamber with a plurality of electrical conduits therein. The loading device has a conveyor for releasably holding a plurality of semiconductors and for loading such semiconductors into the chamber such that they are in electrical communication with the electrical conduits.

BRIEF DESCRIPTION OF THE DRAWINGS

For a further understanding of the nature and objects of the present invention, reference should be made to the following detailed description, taken in conjunction with the accompanying drawings, in which like parts are given like reference numerals and wherein:

FIG. 1 is a pictorial view of an integrated circuit in a DIP package;

FIG. 2 is a pictorial view of an integrated circuit packaging tube with integrated circuits therein;

FIG. 3 is a pictorial view of the preferred embodiment of the apparatus of the system of the invention showing the semiconductors being unloaded from their storage container and loaded into the cartridge assembly;

FIG. 4 is an enlarged, fragmentary pictorial frontal view, partially in section, of the cartridge assembly of the preferred embodiment of the apparatus of the system of the invention;

FIG. 5 is an enlarged, fragmentary pictorial view, partially in section, of one of the carrier strips of the cartridge assembly of the preferred embodiment of the apparatus of the system of the invention; and FIG. 6 is an enlarged, fragmentary pictorial rear view of the cartridge assembly of the preferred embodiment of the apparatus of the system of the present invention.

DETAILED DESCRIPTION OF THE PREFERRED EMBODIMENT

1. Introduction

The system of the present invention is especially well-suited for temporarily packaging integrated circuits having a dual-in-line ("DIP") package configuration. Although the system is adaptable to DIP packages having any physical dimension or number of pins, the physical dimensions of the apparatus of the system of the preferred embodiment of the invention will vary depending on the physical dimensions and, in some cases, the number of pins of the integrated circuits to be temporarily packaged. Therefore, in order to facilitate the description of the preferred embodiment of the apparatus of the invention, the physical dimensions of the embodiment described will be such that the embodiment can be used for temporarily packaging the generic DIP integrated circuit shown in FIG. 1. Thus, referring to FIG. 1, such a generic integrated circuit includes body 2 and terminal pins 3. Body 2 has length l, height h and width w. Terminal pins 3 are arranged in opposing pin columns on opposite sides of body 2, the pins of one column diverging slightly from the pins of the other column moving away from body 2. The pins of the opposing columns are distance a apart adjacent lower surface 4 of body 2 and distance b apart at their tips. Pin 3 are made of a resilient material such that when the tips of pins 3 are compressed inwardly, they exert an outward force. The length of pins 3 is such that the maximum distance from the tips of pins 3 to lower surface 4 of body 2 is s. Although the integrated circuit of FIG. 1 is shown as including 14 pins, it will be understood that the generic DIP integrated circuit has 2x pins, x being the number of pins in each column. The center-to-center distance between adjacent pins of a column is y, and the distance from each end of body 2 to the center of each pin adjacent such end is z.

Furthermore, the system of the present invention is especially useful when the integrated circuits are stored, after manufacture in elongate tube 6 (see FIG. 2) having open ends 7, 8 which are covered by removable caps 9, 10, respectively. In such a storage system, which is commonly used in the prior art, integrated circuits are loosely packed within tube 6 such that by removing one of the caps, e.g., cap 9, and tilting tube 6 so that the open end, e.g., end 7, is positioned below the other end, the integrated circuits will slide out of tube 6 one at a time through such open end.

2. Apparatus of the Invention

Referring to FIG. 3, the apparatus of the system of the invention includes loading assembly 11 and cartridge assembly 13.

Loading assembly 11 includes drive rollers 15, 17, crank 18, conveyor 19 and support platform 21.

Rollers 15, 17 have a substantially identical generally cylindrical configuration and are rotatably supported by any of a variety of methods readily apparent to those skilled in the art such that the axes of the rollers are spaced apart a distance c and are in a common, generally horizontal plane. Crank 18 is connected to the axis of roller 15 such that roller 15 will rotate when crank 18 is turned.

Conveyor 19 includes endless belt 23, having inner surface 25 and outer surface 27, and a plurality of fingers 29. Belt 23 is looped about rollers 15, 17 with sufficient tautness that the portion of belt 23 extending between the upper portions of rollers 15, 17 is substantially flat and horizontal. The outer surface of roller 15 engages inner surface 25 of belt 23, such as by frictional engagement, such that rotation of roller 15 will cause belt 23 to move in a loop about rollers 15, 17. Fingers 29 (i) extend perpendicularly from outer surface 27 of belt 23 a distance approximately equal to, but no greater than, L, (ii) have a width approximately equal to, but no greater than, a, and (iii) have a thickness slightly greater than s. Fingers 29 are equally spaced along outer surface 27 of belt 23, so as to form a gap 31 between each pair of adjacent fingers, the width of each gap 31 adjacent outer surface 27 being approximately equal to, but no less than, h.

Because fingers 29 extend perpendicularly from outer surface 27, the width of each gap 31 between each pair of adjacent fingers along the portion of belt 23 extending between the upper portions of rollers 15, 17 will be substantially constant moving from outer surface 27 to the tips of such fingers. The width of each gap 31 between each pair of adjacent fingers along the portion of belt 23 extending around roller 15, e.g., gap 31A, and on the portion of belt 23 extending around roller 17, e.g., gap 31B, will increase moving from outer surface 27 to the tips of such fingers, whereby the width at such tips will be greater than d. Thus, as belt 23 moves in a loop about rollers 15, 17, the gap 31 between a particular adjacent pair of fingers will "open" as the portion of belt 23 from which such fingers extend moves around a roller and will "close" as such portion of belt 23 moves between the rollers.

Platform 21 has flat upper surface 33 and is disposed between rollers 15, 17 and through the loop formed by belt 23. Platform 21 is rigidly supported such that upper surface 33 is substantially horizontal and positioned distance f below the portion of outer surface 27 of belt 23 extending between the upper portions of rollers 15, 17.

Referring to FIGS. 3 and 4, cartridge assembly 13 includes elongate hollow casing 71, preferably made of extruded aluminum and of generally rectangular cross section, having a top wall 73, side walls 75, 77, bottom wall portions 79, 81 and open ends 83, 85. Side walls 75, 77 are parallel to each other and are perpendicular to top wall 73. Side walls 75, 77 and top wall 73 are substantially equal in thickness, such thickness being small relative to the height and width, respectively, of the side and top walls. Bottom wall portions 79, 81 are substantially equal in width and have a thickness substantially the same as that of the side and top walls. Bottom wall portions 79, 81 project perpendicularly and inwardly from side walls 75, 77, respectively, and extend from end 83 to end 85 of casing 71.

An aperture or slot 87 is defined by opposing inner side faces 89, 91 of bottom wall portions 79, 81. Aperture 87 is slightly wider than conveyor 19 such that casing 71 can be placed down over conveyor 19 and rested on platform 21 with conveyor 19 extending through casing 71 (See FIG. 3).

Top wall 73 has a plurality of vents or ports 93 therethrough for permitting circulation of air between the interior and exterior of casing 71.

Casing 71 further includes substantially identical rectangular cross-section ribs 95, 97, 99, 101 extending from end 23 to end 85. Ribs 99, 101 extend perpendicularly from the inner face of bottom wall portions 79, 81. Ribs 95, 97 extend perpendicularly from the inner face of top wall 73 such that they are opposed to ribs 99, 101, respectively.

Casing 71 further has opposed dovetail notches 100, 102 extending through side walls 75, 77, respectively, at end 85.

Cartridge assembly 13 further includes locking pin 104 adapted to be received in notches 100, 102 and held therein by friction fit such that pin 104 extends across open end 85. Pin 104 includes elongate rib 106 extending away from casing 71 when pin 104 is received in notches 100, 102.

Cartridge assembly 13 also includes a pair of carrier strip mechanisms 103 disposed inside casing 71 and extending along most of the length of casing 71 on opposite sides of the aperture 87.

Referring to FIGS. 4, 5, and 6, each carrier strip mechanism 103 includes a carrier strip 105. Preferably, each strip 105 is made of a rigid, durable, electrically insulative material, such as that sold under the mark "Reyton," and is manufactured by injection molding. Each strip 105 is somewhat shorter lengthwise than casing 71, such that the casing extends a distance X beyond the front end of each strip 105 and a distance Y beyond the back end of each strip 105. The height of each strip 105 is slightly less than the inside or clearance height of casing 71. The width of each strip 105 is approximately equal to the width of bottom wall portions 79, 81.

Each carrier strip 105 includes top surface 107, bottom surface 109, inner side surface 111, outer side surface 113, front end 115, and back end 117. Top surface 107 has groove 119 extending longitudinally from front end 115 to back end 117 and disposed slightly nearer to outer side surface 113 than to inner side surface 111. Similarly, bottom surface 109 has groove 125 extending longitudinally along the complete length of the strip and opposed to groove 119. Grooves 119, 125 are of a shape correlative to inwardly projecting ribs 95, 97, 99, 101 of casing 71 such that they can receive an opposed pair of such ribs. According to such a configuration, one strip 105 can be mounted in casing 71 by, for example, placing casing 71 and such strip end-to-end and aligning ribs 95, 99 to grooves 119, 125, respectively, and then sliding such strip into the casing along ribs 95, 99.

After insertion of a strip 105 into casing 71, relative longitudinal axial movement of the casing and such strip is substantially prevented by a pair of set screws 127 disposed in sockets 129 in the side wall of casing 71 adjacent such strip. When the set screws are tightened, the ends of set screws 127 opposite the heads extend into cylindrical receptacles (not shown) in outer side surface 113 of such strip. Movement of the carrier strip relative to the casing is limited by the abutment of the shanks of the screws against the walls of such receptacles.

The space between the opposing ribs received by grooves 119, 125 of a strip 105 and the inside face of the side wall of casing 71 adjacent such strip is wider than the portion of such strip between grooves 119, 125 and outer side surface 113 of such strip. Also, grooves 119, 125 are wider than the ribs 95, 99, thus allowing limited sliding travel of the carrier strip in directions transverse to the longitudinal axis of casing 71, e.g. toward or away from such axis in a direction generally perpendicular to the side walls of casing 71. Outer side surface 113 of each strip 105 inward of the ends 115, 117 has a recessed or cut out region 131 (See FIG. 4) of elongate rectangular configuration extending longitudinally of the strip from about 1.0 inches from the front end 115 to about 1.0 inches from the back end 117. Cut out region 131 has a depth of about 0.07 inches and a height of about 0.85 inches. Each carrier strip mechanism 103 further includes elongate double-S-shaped spring 133 compressed into the cut out region 131 between the side wall of casing 71 adjacent the strip of such mechanism and such strip. Thus, spring 133 bears upon the wall and the strip, urging the strip away from the wall and inwardly toward aperture 87. Spring 133 occupies substantially the entire cut out region 131, and, in the preferred embodiment, has a length of about 18 inches and a height of about 0.125 inches in its uncompressed state. Spring 133 can be made of any suitably flexible and resilient material such as, for example, strip steel of 1/32 thickness, or 0.03.

Each carrier strip 105 further includes (i) x i.e., the number of pins in each column of the generic DIP integrated circuit parallel spaced-apart U-shaped channels 135 in its inner side portion 111, channels 135 extending longitudinally of the strip along its entire length, (ii) dovetail cross-section notches 141, 143 extending into outer side portion 113 of such strip at either end of such strip, and (iii) a plurality of spaced-apart parallel grooves 145 extending along the ends of such strip between channels 135 and notches 141, 143. The center-to-center distance between adjacent channels is y, i.e., the center-to-center distance between the adjacent pins of a column of pins of the generic DIP integrated circuit. Channels 135 are partially filled with an electrically and thermally insulative material 137 such as, for example, silicone rubber that may be molded or vulcanized into the channels. An electrically conductive bus bar 139 is disposed such that the bus bar overlays the insulative material 137 of such channel and is recessed slightly from the edges of the openings of such channel. In the preferred embodiment, each bus bar 139 is made of nickel-plated copper, but other materials such as Beryllium Copper may be used. Bus bars 139 are longer than strip 105 and extend around the ends of strip 105 along grooves 145 and into notches 141, 143. Each carrier strip mechanism 103 further includes dovetail pins 147, 149 which have interference fits with notches 141, 143, respectively. The pins 147, 149 are wedged into the notches 141, 143, the ends of the bus bars 139 which extend into the notches being clamped between the strip and the pin and being retained therebetween by friction. Dovetail pins 147, 149 preferably are made of "Reyton" by injection molding.

The corresponding dimensions of the various components of loading assembly 11 and cartridge assembly 13, as described supra, should be such that when a pair of strip mechanisms 103 are secured in casing 71 and casing 71 is placed over conveyor 19 and rested on platform 21 with conveyor 19 extending through casing 71 as shown in FIG. 3, (i) the bus bars of each strip mechanism 103 will be aligned with and opposed to one another, (ii) the centers of the lowermost bus bars of each strip mechanism will be spaced above the portion of outer surface 27 of belt 23 extending through casing 71 by a distance substantially equal to z, i.e., the distance from each end of body 2 of the generic DIP integrated circuit to each pin adjacent such end, and (iii) the minimum distance between the opposing bus bars of strip mechanisms 103, i.e., the distance between such bus bars when springs 133 force strips 105 inwardly to the maximum extent, will be approximately equal to a.

Cartridge assembly 13 further includes plug unit 154 having a configuration substantially identical to that of the DIP integrated circuit for which the cartridge assembly 13 is designed. Unit 154 includes banana plugs 155, 157 secured in the body of unit 154 and extending in the direction opposite the direction the pins of unit 154 extend. Each of plugs 155, 157 is electrically connected to one or more of the pins of unit 154, the particular pin or pins to which such plugs are connected depending on the nature of the bias or clocking signals to be applied as well as the configuration of the pins of the integrated circuits to undergo burn-in. For example, if the integrated circuits to undergo burn-in are 16 pin, TTL digital integrated circuits with Vcc at pin 16 and ground at pin 8, and such circuits are to be forward biased across their power connections, one of plugs 155, 157 will be connected to pin 8 of unit 154 and the other of plugs 155, 157 will be connected to pin 16 of unit 154. Alternative connections will be readily apparent to those of ordinary skill in the art in view of this description.

3. Method of the Invention

Using the apparatus of the preferred embodiment of the invention, a plurality of integrated circuits can be packaged for burn-in purposes as follows:

First, cartridge assembly 13 is placed over conveyor 19 of loading assembly 11 and rested on platform 21 such that conveyor 19 extends through casing 71. Then, one of the caps, e.g., cap 9, is removed from a tube 6 containing a plurality of integrated circuits to undergo burn-in. Tube 6 is then positioned at one end of conveyor 19, e.g., proximate roller 15, such that end 7, i.e., the open end, is positioned just above a finger 29, e.g., fiber 29A, along the portion of belt 23 extending around roller 15 (see FIG. 3). Tube 6 is inclined downwardly toward end 7 such that the integrated circuit within tube 6 at end 7 tends to slide from tube 6 and rests against the end of the finger 29A. Tube 6 should be oriented such that the pins of the integrated circuits within tube 6 extend generally away from casing 71.

Crank 18 is then turned clockwise such that finger 29A moves away from end 7 of tube 6 and toward casing 71. When finger 29A is completely clear of end 7, the integrated circuit at end 7 of tube 6 will fall downwardly into the gap adjacent finger 29A. The next integrated circuit in tube 6 will then move adjacent end 7 but will be prevented from falling from tube 6 by the first integrated circuit. As crank 18 continues to be turned, however, another gap will be positioned below end 7 and the next integrated circuit will fall into such gap. Thus, as crank 18 is turned, the integrated circuits in tube 6 will fall one at a time into the successive gaps of conveyor 19. It should be noted that because tube 6 is positioned adjacent one end of conveyor 19, the gaps will be open when the integrated circuits fall into them, thereby facilitating the movement of the integrated circuits onto the conveyor. The gaps will then close around the integrated circuits as they are moved away from the end of conveyor 19 toward casing 71.

As crank 18 continues to be turned, conveyor 19 carries the integrated circuits into casing 71 through open end 83 such that the integrated circuits slide between the opposing carrier strip mechanisms 103. In accordance with the dimensional relationships among the integrated circuits, loading assembly 11 and cartridge assembly 13 as described supra, the pins of one column of each integrated circuit will contact and slide along the bus bars of one of the carrier strip mechanisms 103 and the pins of the other column of each integrated circuit will contact and slide along the other carrier strip mechanism 103. Such movement of the integrated circuits between mechanisms 103 will cause strips 105 to move outwardly against the force of springs 133 and will cause the pins of the integrated circuits to be compressed slightly inwardly. As a result of such movement and compression, each integrated circuit is held securely between mechanisms 103 such that (i) each pin of each integrated circuit positioned between mechanism 103 is in firm electrical contact with one of the bus bars and (ii) movement of each integrated circuit positioned between mechanisms 103 is permitted only in a direction parallel to the axis of casing 71.

Rotation of crank 18 is continued until integrated circuits are positioned along the entire length of cartridge assembly 13. Cartridge assembly 13 is then lifted generally vertically upward away from platform 21. Because of the forces between the carrier strips and the integrated circuit that prevent movement of the integrated circuits relative to the cartridge assembly in a direction transverse to the axis of casing 71, the integrated circuits positioned between mechanisms 103 will be removed from conveyor 19 and will be retained in cartridge assembly 13.

Plug unit 154 is then inserted into casing 71 through open end 85 until the pins of unit 154 are firmly engaged by the bus bars of carrier strip mechanisms 103.

Pin 104 is then inserted into notches 100, 102 at end 85 of casing 71 so as to hold plug unit 154. It should be noted that the banana plugs of unit 154 should be long enough to extend well beyond pin 104.

The integrated circuits within cartridge assembly 13 can then be subjected to burn-in by placing cartridge assembly 13 in an appropriate burn-in chamber equipped with a socket for receiving the banana plugs of plug unit 154. While cartridge assembly 13 is in the burn-in chamber, appropriate signals can be supplied simultaneously to all integrated circuits packaged in cartridge assembly 13 by supplying appropriate biases and signals to an appropriate plug unit 154, such biases and signals being transmitted from plug unit 154 to the integrated circuits through the bus bars.

It should be readily apparent from the foregoing description that plug unit 154 can be modified in a number of ways readily apparent to those of ordinary skill in the art, including using a different number or different type of plug, e.g., a multi-pin connector instead of a pair of banana plugs.

Furthermore, it should be noted that during burn-in, temperature uniformity will be facilitated by the flow of air through ports 93 in casing 71.

When burn-in is completed, plug unit 154 is disconnected from the socket, pin 104 and plug unit 154 are removed, and cartridge assembly 13 is removed from the chamber and again placed on platform 21 such that the integrated circuits within cartridge assembly 13 are inserted into the gaps of the portion of conveyor 19. Crank 18 is then rotated in the same direction whereby the integrated circuits will be pulled from cartridge assembly 13 by conveyor 19. As rotation of crank 18 continues, the integrated circuits will eventually reach the end of conveyor 19 opposite that at which they were loaded onto conveyor 19, e.g., the end that moves around roller 17, where they will fall from conveyor 19 by the force of gravity. By appropriately positioning an empty tube 6 at such end of conveyor 19, the integrated circuits can be made to fall into such tube so that they can be easily set up for post burn-in testing.

Although the invention described in detail supra has been found to be most satisfactory and preferred, many variations in structure are possible without departing from the spirit of the invention.

Because many varying and different embodiments may be made within the scope of the inventive concept herein taught and because many modifications may be made in the embodiment herein detailed in accordance with the descriptive requirements of the law, it should be understood that the details herein are to be interpreted as illustrative and not in a limiting sense.

What is claimed as invention is:

1. A system for temporarily packaging semiconductors comprising:
    cartridge means for holding such semiconductors, said cartridge means including an elongate chamber and a plurality of electrical conduits within said chamber; and
    loading means for sequentially loading such semiconductors into said chamber from one end of said chamber such that such semiconductors are in electrical communication with said electrical conduits, said holding means being actuated into engagement with such semiconductors upon such semiconductors entering said chamber from said one end.

2. The system of claim 1 wherein said loading means includes conveyor means for releasably holding such semiconductors in a line, said conveyor means being movable in the direction of said line, said line being coaxial with the longitudinal axis of said chamber, such semiconductors in said line being transported along said line into the interior of said chamber upon movement of said conveyor means, said cartridge means including means biased into engagement with such semiconductors for effecting such holding of such semiconductors when such semiconductors are disposed inside said chamber.

3. The system of claim 2 wherein said conveyor means includes an endless belt having a plurality of outwardly extending rectangular shaped fingers disposed thereon defining gaps therebetween within which such semiconductors are releasably held.

4. The system of claim 1 wherein said electrical conduits extend in a direction substantially parallel to the axis of said chamber.

5. The system of claim 4 wherein said cartridge means includes at least one carrier strip mounted within said chamber, at least a portion of said electrical conduits being mounted on said carrier strip, said carrier strip including a plurality of longitudinally extending channels on one side thereof in which said portions of said electrical conduits are disposed.

6. The system of claim 5, wherein there is a space between each of said portions of said conduits and the walls of said channels, and there is further included a thermally and electrically insulative material in said channels filling such spaces.

7. The system of claim 6, wherein said thermally and electrically insulative material is resilient.

8. System according to claim 1, wherein said cartridge means is movable between a first position remote from said loading means and a second position wherein at least a portion of said loading means is disposed inside said chamber, said loading means including means for moving such semiconductors along the length of said chamber when such semiconductors are disposed on said portion of said loading means and said cartridge means is in said second position while said holding means remains in engagement with all of such semiconductors in said chamber.

9. A system for temporarily packaging semiconductors comprising:
    cartridge means for holding such semiconductors, said cartridge means including an elongate chamber and a plurality of electrical conduits within said chamber; and
    loading means for loading such semiconductors into said chamber such that such semiconductors are in electrical communication with said electrical conduits, said loading means including conveyor means for releasably holding such semiconductors in a line, said conveyor means being movable in the direction of said line, and wherein said chamber of said cartridge means has an elongate opening on one side for permitting placement of said chamber over said conveyor means of said loading means.

10. A system for temporarily packaging semiconductors comprising:
    cartridge means for holding such semiconductors, said cartridge means including an elongate chamber and a plurality of electrical conduits within said chamber, said electrical conduits extending in a direction substantially parallel to the axis of said chamber, said cartridge means including at least one carrier strip mounted within said chamber, at least a portion of said electrical conduits being mounted on said carrier strip, wherein said carrier strip is movable with respect to said chamber in a direction generally transverse to the axis of said chamber.

11. The system of claim 10 wherein said cartridge means includes resilient means for opposing movement of said carrier strip with respect to said chamber in a direction generally away from the axis of said chamber.

12. The system of claim 11, wherein said resilient means includes an elongate spring disposed between the side wall of said chamber and said carrier strip, said spring biasing said carrier strip toward said axis of said chamber.

13. The system of claim 12, wherein said spring has a substantially double-S configuration.

14. The system of claim 12, there being opposing inwardly projecting ribs on the top and bottom walls of said chamber, there being grooves in the top and bottom sides of said strip, said grooves being shaped correlatively to said ribs, said ribs being received in said grooves.

15. A system for temporarily packaging semiconductors comprising:
    cartridge means for holding such semiconductors, said cartridge means including an elongate chamber and a plurality of electrical conduits within said chamber, said electrical conduits extending in a direction substantially parallel to the axis of said chamber, said cartridge means including at least one carrier strip mounted within said chamber, at least a portion of said electrical conduits being mounted on said carrier strip, wherein at least a portion of each of the conduits attached to said carrier strip is movable with respect to said carrier strip in a direction generally transverse to the axis of the chamber.

16. The system of claim 15 wherein said cartridge means includes resilient means for opposing movement of the movable portion of the conduits attached to said carrier strip toward said carrier strip.

* * * * *